United States Patent
Cho et al.

(10) Patent No.: US 7,405,760 B2
(45) Date of Patent: Jul. 29, 2008

(54) IMAGE PICKUP DEVICE WITH NON-MOLDED DSP CHIP AND MANUFACTURING METHOD

(75) Inventors: Min Kyo Cho, Seoul (KR); Sa Yoon Kang, Seoul (KR); Young Hoon Ro, Cheonan (KR); Young Shin Kwon, Yongin (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 679 days.

(21) Appl. No.: 10/347,184

(22) Filed: Jan. 21, 2003

(65) Prior Publication Data
US 2003/0234886 A1 Dec. 25, 2003

(30) Foreign Application Priority Data
Jun. 19, 2002 (KR) .............................. 2002-34345

(51) Int. Cl.
*H04N 5/225* (2006.01)

(52) U.S. Cl. .................. 348/340; 348/373; 348/374; 348/375; 348/376

(58) Field of Classification Search ................ 348/340, 348/373–376; 250/208.1; 438/613, 106, 438/107, 116
See application file for complete search history.

(56) References Cited

U.S. PATENT DOCUMENTS

| 5,366,933 | A | * | 11/1994 | Golwalkar et al. | ............. | 29/827 |
| 5,545,922 | A | * | 8/1996 | Golwalkar et al. | ........... | 257/676 |
| 6,426,283 | B1 | * | 7/2002 | Chen et al. | .................. | 438/613 |
| 6,521,881 | B2 | * | 2/2003 | Tu et al. | .................. | 250/208.1 |
| 6,558,978 | B1 | * | 5/2003 | McCormick | ................ | 438/108 |
| 6,768,516 | B2 | * | 7/2004 | Yamada et al. | .............. | 348/340 |
| 6,841,859 | B1 | * | 1/2005 | Thamby et al. | ............. | 257/676 |

FOREIGN PATENT DOCUMENTS

| JP | 2001-230397 | 8/2001 |
| JP | 2001-358997 | 12/2001 |
| JP | 2001-245217 | 9/2007 |

* cited by examiner

Primary Examiner—James M Hannett
(74) Attorney, Agent, or Firm—Harness, Dickey & Pierce, PLC

(57) ABSTRACT

An image pickup device and a manufacturing method thereof. A digital signal processing (DSP) chip is attached on a first surface of a substrate. A CMOS image sensor (CIS) chip is attached on an active surface of the DSP chip. The DSP chip and the CIS chip may be electrically connected to the substrate by wire bonding. A housing kit having a lens configured to transmit an image to the DSP chip may be mounted on the substrate. An inner space between the housing kit and the substrate is not molded, thereby simplifying a manufacturing process and providing a thinner and/or lighter image pickup device.

18 Claims, 3 Drawing Sheets

IMAGE PICKUP DEVICE WITH NON-MOLDED DSP CHIP AND MANUFACTURING METHOD

CROSS REFERENCE TO RELATED APPLICATIONS

This U.S. non-provisional application claims priority under 35 U.S.C. §119 to Korean Patent Application No. 2002-34345 filed Jun. 19, 2002, the entire contents of which are incorporated by reference.

BACKGROUND OF THE INVENTION

1. Field of the Invention

The present invention relates to a semiconductor integrated circuit device, and more particularly to an image pickup device and a manufacturing method thereof.

2. Description of the Related Art

With the growing proliferation of digital networks, personal computers, cellular phones and personal digital assistants (PDAs) an image sensor chip is desirable and the demand for video communications is growing at a rapid pace.

A CMOS image sensor offers low power consumption superior to that of a charge-coupled device (CCD), and its use is expected to expand dramatically in fields including cellular telephone and other portable equipments.

FIG. 1 is a cross sectional view of a conventional image pickup device 101 having a CMOS image sensor chip 105. An image passing through a lens 102 and an infrared filter 104 reaches the CMOS image sensor (CIS) chip 105. The CIS chip 105 senses pixels of the image and processes the image in to data. A digital signal processing (DSP) chip 108 converts the image data into electrical signals. The image signals are stored in a memory device 111 of a mother board 110 through passive devices 107 such as resistors and capacitors and then are visually represented on a display 112. The image pickup device 101 is typically connected to the motherboard 110 by a flexible printed circuit board (FPCB) 109.

The conventional image pickup device 101 is fabricated as follows. The passive devices 107, such as resistors and capacitors, are mounted on a double-sided printed circuit board (PCB) 106. The DSP chip 108 is attached on and wire-bonded to the PCB 106. The passive devices 107 and the DSP chip 108 are molded in molding compound such as epoxy for protection from the external environment. The CIS chip 105 is attached on the surface opposite to the DSP chip-attached surface of the PCB 106 and is wire-bonded to the PCB 106. A housing kit 103 which has the lens 102 and infrared filter 104 is mounted on the PCB 106.

However, molding of the DSP chip 108 causes an increase in thickness and weight of the image pickup device 101, is an additional process that must be carried out and provides poor heat dissipation, resulting in malfunctions and a shortened life of the DSP chip 108.

SUMMARY OF THE INVENTION

In an exemplary embodiment, the present invention is directed to an image pickup device that is thinner and lighter which is manufactured by a simplified process that improves productivity.

In an exemplary embodiment, the present invention is directed to an image pickup device with improved heat dissipation capability.

In an exemplary embodiment, the present invention is directed to An image pickup device comprising a digital signal processing (DSP) chip attached on a first surface of a substrate and electrically connected to the substrate, the DSP chip having an active surface facing upward and a CMOS image sensor (CIS) chip attached on an active surface of the DSP chip and electrically connected to the substrate, the CIS chip having an active surface facing upward.

The substrate may be electrically connected to the DSP chip and the CIS chip by wire bonding. A wire used in the wire bonding may have a diameter of 1.0 to 2.0 mil. The substrate may be a printed circuit board or flexible printed circuit board.

In another exemplary embodiment, the present invention is directed to a method for manufacturing an image pickup device, the method comprising attaching a DSP chip on a first surface of a substrate such that an active surface of the DSP chip faces upward, applying an adhesive to an active surface of the DSP chip, and attaching a CIS chip on the active surface of the DSP chip such that an active surface of the CIS chip faces upward.

In an exemplary embodiment, the electrical connection of the CIS chip and the DSP chip to the substrate may be performed by using a wire having the diameter of 1.0 to 2.0 mil.

In another exemplary embodiment, the method for manufacturing the image pickup device may further include back-lapping the DSP chip and the CIS chip prior to attaching the DSP chip and the CIS chip on the substrate.

In another exemplary embodiment, the substrate may be a printed circuit board or flexible printed circuit board.

BRIEF DESCRIPTION OF THE DRAWINGS

The present invention will be readily understood with reference to the following detailed description thereof provided in conjunction with the accompanying drawings, wherein like reference numerals designate like structural elements, and, in which.

DETAILED DESCRIPTION OF EXEMPLARY EMBODIMENTS OF THE INVENTION

Exemplary embodiments of the present invention will be described below with reference to the accompanying drawings.

Figure 1:
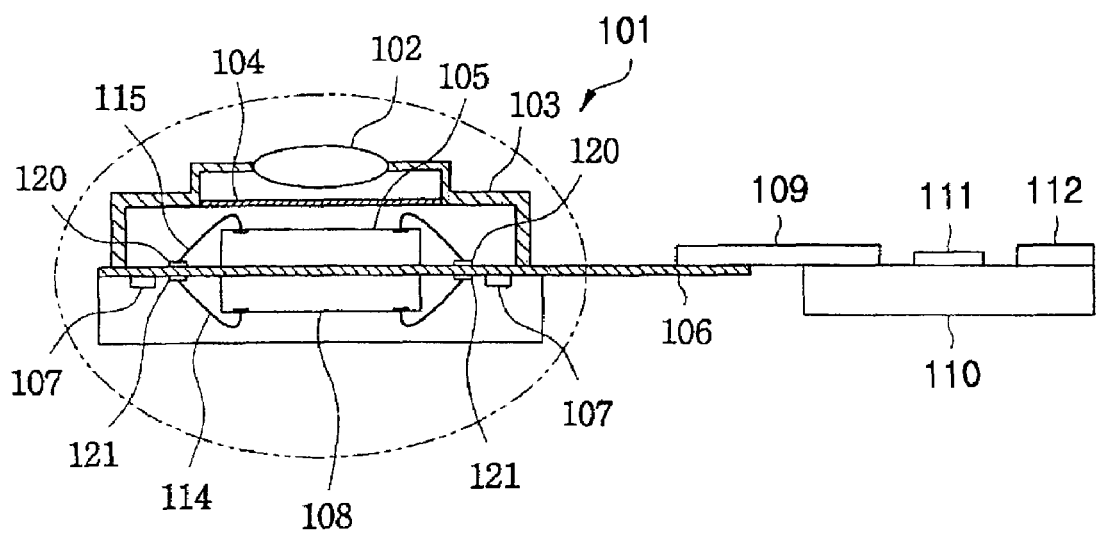
FIG. 1 is a cross sectional view of a conventional image pickup device.
Figure 2:
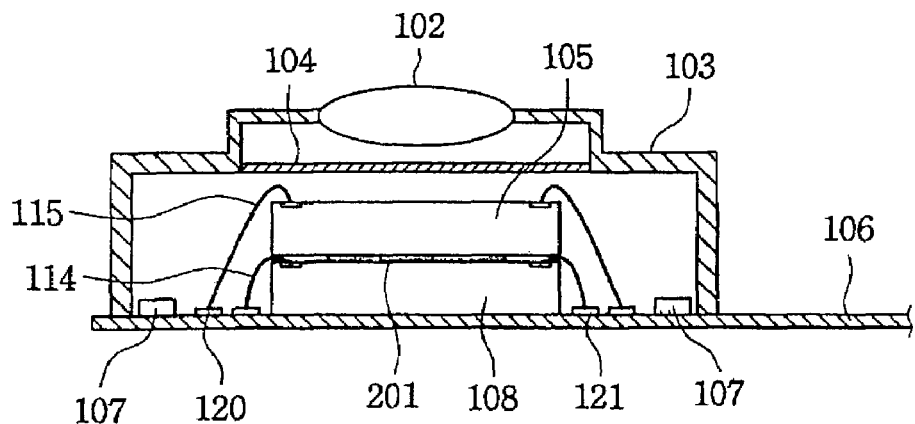
FIG. 2 is a cross sectional view of an image pickup device in accordance with an exemplary embodiment of the present invention.

FIG. 2 is a cross sectional view of an image pickup device 101 in accordance with an exemplary embodiment of the present invention. The image pickup device 101 has a chip-on-chip structure wherein a CMOS image sensor (CIS) chip 105 and a digital signal processing (DSP) chip 108 are stacked.

A passive device 107 such as a resistor or a capacitor is mounted on a first surface of a printed circuit board (PCB) 106. The DSP chip 108 is attached on the PCB 106 such that an active surface of the DSP chip 108 faces upward. The PCB 106 may be connected to a motherboard (not shown) by a flexible printed circuit board (FPCB) (not shown). The passive device 107 and the DSP chip 108 may be mounted on the FPCB 109 instead of the PCB 106.

The CIS chip 105 is mounted on the active surface of the DSP chip 108 using an adhesive (or other technique known to one of ordinary skill in the art) such that an active surface of the CIS chip 105 faces upward. Electrode pads of the DSP chip 108 and the CIS chip 105 are electrically connected to bonding pads 121 and 120 of the PCB 106 by wire bonding.

A housing kit 103 includes a lens 102 and an infrared filter 104. The housing kit 103 is configured such that light reflected from an image passes through the lens 102 and the infrared filter 104 and reaches the CIS chip 105. Although an exemplary embodiment shows an in-line arrangement, the lens 102 and the filter 104 may have other alternative arrangements using mirrors or other reflectors for changing the direction of light.

In the exemplary configuration illustrated in FIG. 2, an inner space between the housing kit 103 and the PCB 106 need not be molded. For protection from external shock, the wire 114, 115 used in electrically connecting electrode pads of the CIS chip 105 and the DSP chip 108 to the bonding pads 121 and 120 of the PCB 106, may have a greater diameter than that of the conventional image pickup device. The diameter of the wire is may be 1.0 to 2.0 mil.

Figure 3A:
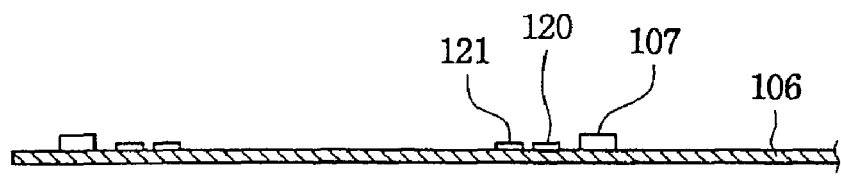
FIGS. 3a and 3g are views illustrating steps for manufacturing the image pickup device in accordance with an exemplary embodiment of the present invention.
Figure 3B:
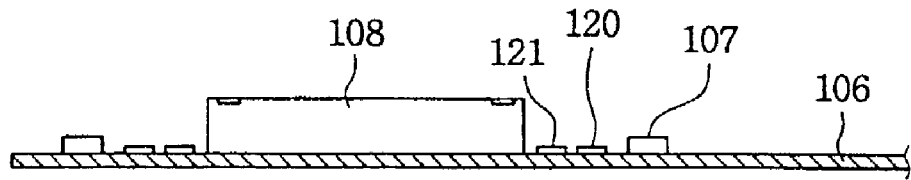
Figure 3C:
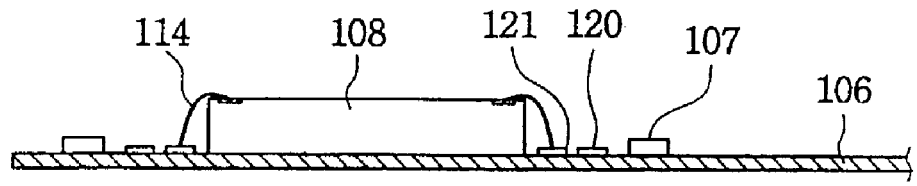
Figure 3D:
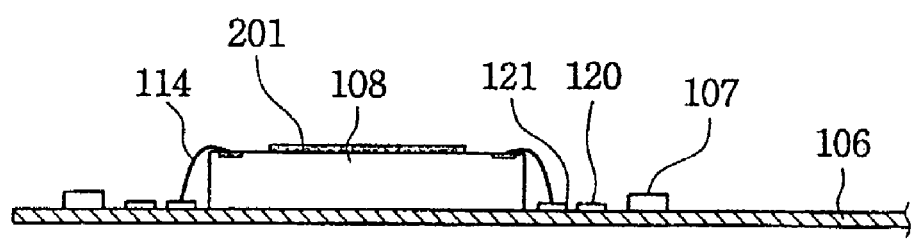
Figure 3E:
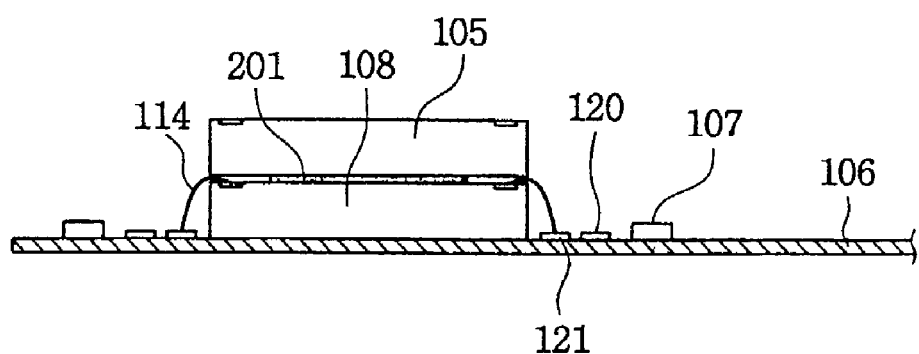
Figure 3F:
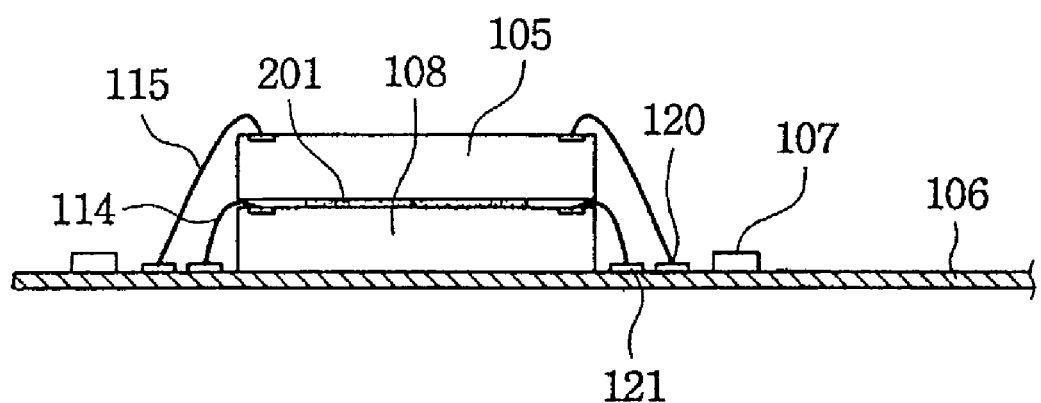
Figure 3G:
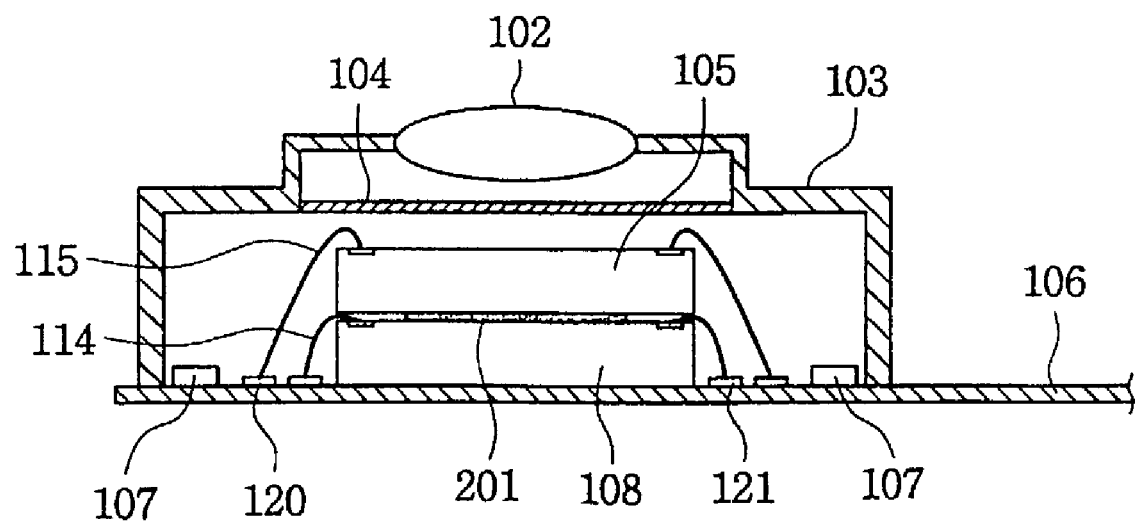

FIGS. 3a and 3g are views illustrating steps for manufacturing the image pickup device 101 in accordance with an exemplary embodiment of the present invention.

FIG. 3a illustrates mounting at least one passive device 107 on a PCB 106. The at least one passive device 107 such as a resistor and/or a capacitor is mounted on a first surface of the PCB 106. The at least one passive device 107 may be mounted on a FPCB 109 instead of the PCB 106. In the case of the FPCB 109, the process thereafter is the same as the process with the PCB 106.

FIG. 3b illustrates attaching a DSP chip 108 on the PCB 106. The DSP chip 108 is attached on the first surface of the PCB 106 using an adhesive (not shown) such that the active surface of the DSP chip 108 faces upward.

To reduce the thickness of the image pickup device 101, the DSP chip 108 may be backlapped. In addition, the height of a housing kit 103 may be reduced.

FIG. 3c illustrates electrically connecting the DSP chip 108 to the PCB 106 by wire bonding. At least one first wire 114 is connected to the electrode pad of the DSP chip 108 and to at least one first bonding pad 121 of the PCB 106. The diameter of such a wire 114 is conventionally 1.0 mil. In accordance with exemplary embodiments of the present invention, the diameter of the at least one first wire 114 may be 1.0 to 2.0 mil.

FIG. 3d illustrates applying an adhesive 201 on the active surface of the DSP chip 108. The adhesive 201 may be Ag epoxy adhesive tape (or other adhesive known to one of ordinary skill in the art).

FIG. 3e illustrates attaching a CIS chip 105 on the DSP chip 108. The CIS 105 is attached on the active surface of the DSP chip 108 with the adhesive 201 such that the active surface of the CIS chip 105 faces upward. For a thinner image pickup device 101, the CIS chip 105 may be backlapped.

FIG. 3f illustrates electrically connecting the CIS chip 105 to the PCB 106 by wire bonding. A second wire 115 is connected to the electrode pad of the CIS chip 105 and is connected to a second bonding pad 120 of the PCB 106. The diameter of the second wire 115 may also be 1.0 to 2.0 mil.

FIG. 3g illustrates mounting the housing kit 103 on the PCB 106. The housing kit 103 is formed of a desired shape by injection molding and includes a lens 102 and an infrared filter 104. The housing kit 103 is then mounted on the PCB 106.

An inner space between the housing kit 103 and the PCB 106 is not molded, which leads to a simplified process and a thinner image pickup device. To reduce the possibility of the non-molded wires 114 and 115 being cut or contacting each other due to shock, the diameter of the first and second wires 114 and 115 may be 1.0 mil or more.

In accordance with exemplary embodiments of with the present invention, the DSP chip is attached inside the housing kit without the conventional molding process. Accordingly, exemplary embodiments of the present invention provide a thinner and lighter image pickup device with improved heat dissipation capability, thereby simplifying the manufacturing process and thus increasing productivity.

Although the exemplary embodiments of the present invention described above include one DSP chip and one CIS chip, more than one of one or more of both chips may be used. Additionally, the teachings of exemplary embodiments of the present invention may also be applied to securing other chips, as well.

Although the exemplary embodiments of the present invention have been described in detail hereinabove, it should be understood that many variations and/or modifications of the basic inventive concepts herein taught, which may appear to those skilled in the art, will still fall within the spirit and scope of the present invention as defined in the appended claims.

What is claimed is:

1. An image pickup device comprising:
    a substrate having at least one passive device mounted on a first surface thereof;
    a non-molded digital signal processing (DSP) chip attached on the first surface of the substrate, the non-molded DSP chip having a first surface including an active surface facing upward and at least one electrode pad on the active surface electrically connected to the substrate by at least one bonding wire;
    an adhesive directly attached on the active surface of the non-molded DSP chip, the adhesive having a first surface directly attached on the active surface of the non-molded DSP chip and a second surface opposing the first surface;
    a CMOS image sensor (CIS) chip directly attached on the second surface of the adhesive and electrically connected to the substrate, the CIS chip having an active surface facing upward; and
    a housing kit having a lens and an infrared filter and mounted on the substrate, the lens configured to transmit an image to the CIS chip, wherein the adhesive does not fully cover the at least one electrode pad on the active surface of the DSP chip.

2. The device of claim 1, further comprising:
    bonding wires for electrically connecting the CIS chip to the substrate.

3. The device of claim 1, wherein a diameter of the bonding wire is 1.0 to 2.0 mil.

4. The device of claim 2, wherein a diameter of the bonding wire is 1.0 to 2.0 mil.

5. The device of claim 1, wherein the substrate is a printed circuit board.

6. The device of claim 1, wherein the substrate is a flexible printed circuit board.

7. A method for manufacturing an image pickup device, the method comprising:
    mounting a passive device on a first surface of a substrate;
    attaching a DSP chip on the first surface of the substrate such that a first surface of the DSP chip including an active surface of the DSP chip faces upward;
    electrically connecting at least one electrode pad on the active surface of the DSP chip to the substrate by bonding wires;

applying an adhesive to an active surface of the DSP chip such that a first surface of the adhesive contacts the active surface of the DSP chip directly, a second surface of the adhesive opposing the first surface of the adhesive faces upward, and the adhesive does not fully cover the first surface of the DSP chip;

attaching a CIS chip directly on the second surface of the adhesive such that an active surface of the CIS chip faces upward and the adhesive does not cover the at least one electrode pad on the active surface of the DSP chip;

electrically connecting the CIS chip to the substrate by bonding wires; and mounting a housing kit on the substrate, wherein the housing kit has a lens configured to transmit an image to the DSP chip.

8. The method of claim 7, wherein a diameter of the bonding wire connecting the CIS chip to the substrate is 1.0 to 2.0 mil.

9. The method of claim 7, wherein a diameter of the bonding wire connecting the DSP chip to the substrate is 1.0 to 2.0 mil.

10. The method of claim 7, further comprising backlapping the DSP chip and the CIS chip prior to attaching the DSP chip and the CIS chip.

11. The method of claim 7, wherein the substrate is a printed circuit board.

12. The method of claim 7, wherein the substrate is a flexible printed circuit board.

13. An image pickup device manufactured in accordance with the method of claim 7.

14. An image pickup device comprising:
a digital signal processing (DSP) chip attached on a first surface of a substrate and electrically connected to the substrate, the non-molded DSP chip having a first surface including an active surface facing upward and at least one electrode pad on the active surface electrically connected to the substrate by at least one bonding wire;
an adhesive directly attached on the active surface of the non-molded DSP chip, the adhesive having a first surface directly attached on the active surface of the non-molded DSP chip and a second surface opposing the first surface; and
a CMOS image sensor (CIS) chip attached directly on the second surface of the adhesive and electrically connected to the substrate, the CIS chip having an active surface facing upward, wherein the adhesive does not fully cover the at least one electrode pad on the active surface of the non-molded DSP chip.

15. The image pickup device of claim 14, wherein the non-molded DSP chip and the CIS chip are stacked.

16. The image pickup device of claim 14, wherein the non-molded DSP chip and the CIS chip are arranged in a chip-on-chip configuration.

17. A method for manufacturing an image pickup device, the method comprising:
attaching a DSP chip on a first surface of a substrate such that a first surface of the DSP chip including an active surface of the DSP chip faces upward;
electrically connecting at least one electrode pad on the active surface of the DSP chip to the substrate by bonding wires;
applying an adhesive to an active surface of the DSP chip such that a first surface of the adhesive contacts the active surface of the DSP chip directly, a second surface of the adhesive opposing the first surface of the adhesive faces upward, and the adhesive does not fully cover the at least one electrode pad on the active surface of the DSP chip; and
attaching a CIS chip directly on the second surface of the adhesive such that an active surface of the CIS chip faces upward.

18. An image pickup device manufactured in accordance with the method of claim 17.

* * * * *